United States Patent
DiFonzo et al.

(10) Patent No.: US 9,897,465 B2
(45) Date of Patent: Feb. 20, 2018

(54) PORTABLE COMPUTER SLEEP MODE SYSTEM WITH ANGLE SENSOR

(71) Applicant: Apple Inc., Cupertino, CA (US)

(72) Inventors: John C. DiFonzo, Emerald Hills, CA (US); Jean-Marc Gery, Los Angeles, CA (US)

(73) Assignee: Apple Inc., Cupertino, CA (US)

( * ) Notice: Subject to any disclaimer, the term of this patent is extended or adjusted under 35 U.S.C. 154(b) by 129 days.

(21) Appl. No.: 14/862,129

(22) Filed: Sep. 22, 2015

(65) Prior Publication Data

US 2017/0082461 A1    Mar. 23, 2017

(51) Int. Cl.
| | |
|---|---|
| *G06F 1/32* | (2006.01) |
| *G01D 5/16* | (2006.01) |
| *G01R 33/09* | (2006.01) |

(52) U.S. Cl.
CPC .............. *G01D 5/16* (2013.01); *G01R 33/093* (2013.01); *G01R 33/096* (2013.01); *G06F 1/3296* (2013.01)

(58) Field of Classification Search
CPC ........ G06F 1/3202; G06F 1/3231; G06F 1/26; G06F 1/206; G06F 1/3228; G06F 1/08; G06F 1/3289; G06F 1/266; H04L 12/12; H04L 12/10
See application file for complete search history.

(56) References Cited

U.S. PATENT DOCUMENTS

| | | | |
|---|---|---|---|
| 7,288,934 B1 | 10/2007 | Ikarashi et al. | |
| 9,501,287 B2* | 11/2016 | Waltermann | G06F 9/4401 |
| 2003/0203747 A1* | 10/2003 | Nagamine | H04M 1/0243 |
| | | | 455/575.3 |
| 2004/0056651 A1 | 3/2004 | Bersana | |
| 2005/0038982 A1* | 2/2005 | Park | G06F 1/162 |
| | | | 713/1 |
| 2007/0077972 A1 | 4/2007 | Tu et al. | |
| 2009/0144574 A1* | 6/2009 | Tseng | G06F 1/1616 |
| | | | 713/323 |
| 2011/0055608 A1* | 3/2011 | Jin | G06F 1/1616 |
| | | | 713/323 |
| 2015/0258351 A1* | 9/2015 | Barthe | A61N 7/00 |
| | | | 600/439 |

OTHER PUBLICATIONS

Honeywell; "Magnetic Displacement Sensors HMC1501/1512", Form #900246 Rev C, Apr. 2009, 8 pages.

* cited by examiner

*Primary Examiner* — Zahid Choudhury
(74) *Attorney, Agent, or Firm* — Downey Brand LLP

(57) ABSTRACT

A sleep mode system for an electronic device can include a magnetic component and a proximately located sensor configured to detect magnetic field properties that vary with a variable rotation of the magnetic component. The magnetic component can rotate with one device component, such as a laptop lid, while the sensor remains stationary with another device component, such as a laptop base. A controller can determine the orientation angle of the magnetic component based on the detected properties, and can put the device into or remove the device from a sleep mode based on the angle, which can reflect an open state or closed state for the electronic device.

17 Claims, 6 Drawing Sheets

SECTION A-A

PORTABLE COMPUTER SLEEP MODE SYSTEM WITH ANGLE SENSOR

FIELD

The described embodiments relate generally to electronic devices. More particularly, the described embodiments relate to sleep mode systems for electronic devices.

BACKGROUND

Sleep mode systems allow electronic devices to enter a state of low energy use, such as where battery conservation is preferable without deleting cache or ending running program states, for example. In the specific case of laptop computers and other clamshell type electronic devices, a resident sleep mode system can detect whether the computing device is closed and put the device into sleep mode automatically. The sleep mode system may also put the device back into a wake mode when the device is opened. Unfortunately, many conventional sleep mode systems for electronic devices can be inaccurate and are sometimes fooled into activating or switching modes at the wrong times. For example, sleep mode systems using Hall Effect sensors detect when a magnet in a lid or base is relatively near or far away from a corresponding sensor in an opposing base or lid. This type of system can be triggered by other magnets in close proximity to the electronic device, however, resulting in unwanted mode switches. Hall Effect sensors are also relatively inaccurate, such that ordinary part and manufacturing tolerances can result in finished products having varying reliance and sensitivity levels. While sleep mode systems for electronic devices have worked well in the past, there can be room for improvement. Accordingly, there is a need for improved computer sleep mode systems that are more accurate and less foolproof than existing systems.

SUMMARY

Representative embodiments set forth herein disclose various structures, methods, and features thereof for the disclosed portable computer sleep mode systems. In particular, the disclosed embodiments set forth electronic devices having a sleep mode that is more accurate and less foolproof than existing sleep mode systems.

According to various embodiments, a sleep mode system is configured for putting an electronic device into a sleep mode when a closed device configuration is detected. The sleep mode system can include at least: 1) a magnetic component generating a magnetic field, and 2) a sensor disposed proximate the magnetic component and configured to detect magnetic field properties that vary according to a variable rotation of the magnetic component. The sleep mode system can also include a controller in communication with the sensor and adapted to determine an orientation angle of the magnetic component based upon the magnetic field properties.

In some embodiments, an electronic device can employ the sleep mode system to enter a sleep mode when the device is in a closed state and to wake from the sleep mode when the device is in an open state. The electronic device can be a laptop computer, and the magnetic component can be arranged to rotate with the upper portion. The sensor remains stationary within the base portion, such that the orientation angle of the magnetic component with respect to the sensor changes when the upper portion rotates with respect to the base portion.

This Summary is provided merely for purposes of summarizing some example embodiments so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described will become apparent from the following Detailed Description, Figures, and Claims.

Other aspects and advantages of the embodiments described herein will become apparent from the following detailed description taken in conjunction with the accompanying drawings which illustrate, by way of example, the principles of the described embodiments.

BRIEF DESCRIPTION OF THE DRAWINGS

The included drawings are for illustrative purposes and serve only to provide examples of possible structures and methods for the disclosed portable computer sleep mode systems. These drawings in no way limit any changes in form and detail that may be made to the embodiments by one skilled in the art without departing from the spirit and scope of the embodiments. The embodiments will be readily understood by the following detailed description in conjunction with the accompanying drawings, wherein like reference numerals designate like structural elements.

DETAILED DESCRIPTION

Sleep mode systems are a common tool to conserve battery in a computing device without completely ending or deleting programs and temporary memories in the device. Many current sleep mode systems for electronic devices can be inaccurate or improperly triggered, however, such as where an outside magnet near the electronic device is detected by an internal sleep mode system using a Hall Effect sensor. It may thus be useful to provide improved computer sleep mode systems that are more accurate and less foolproof than existing systems.

The embodiments set forth herein thus provide various structures and methods for providing portable computer sleep mode systems having a magnetic component and a sensor that detects magnetic properties that vary with the angular orientation of the magnetic component as it rotates through a range of motion. An associated controller or processor can then be used to determine an orientation angle of the magnetic component. The controller or processor can put the electronic device into or out of a sleep mode depending upon the orientation angle, which can indicate whether the electronic device is open or closed. In the case of a laptop computer, the magnetic component can rotate with the upper component while the proximately located sensor can stay with the base component and not rotate.

The foregoing approaches provide various structures and methods for the disclosed portable computer sleep mode systems. A more detailed discussion of these structures, methods, and features thereof is set forth below and described in conjunction with FIGS. 1-6, which illustrate detailed diagrams of devices and components that can be used to implement these structures, methods, and features.

Figure 1A:
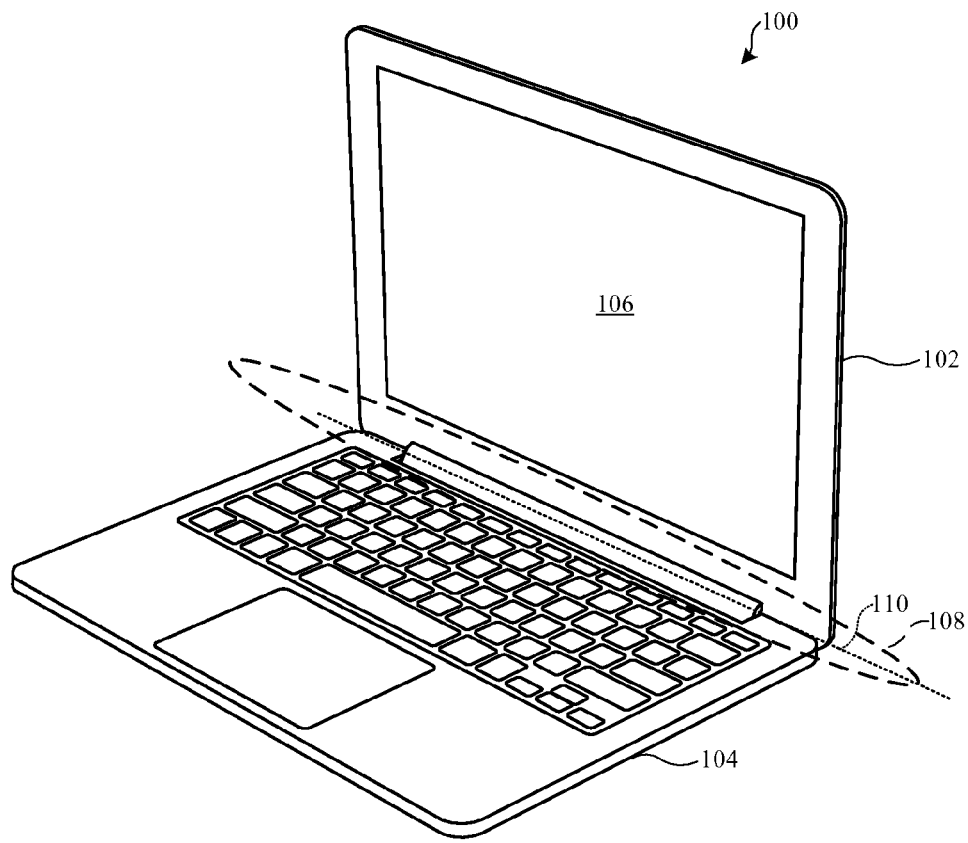
FIG. 1A illustrates in front perspective view an exemplary electronic device in an open state according to various embodiments of the present disclosure.

Turning first to FIG. 1A, an exemplary electronic device in an open state according to various embodiments of the present disclosure is illustrated in front perspective view. Open state electronic device 100 can take the form of a laptop computer, which can include a lid or upper component 102 and a bottom or base component 104. Upper component 102 can house a display 106, electronics for controlling display 106, and other electrical elements. Base component 104 can house a keypad, trackpad, processor, memory, integrated circuits, a battery, and other electrical elements suitable for operating computing device 100. Upper component 102 can be pivotally or rotationally coupled to base component 104 by a hinge assembly or other similar item located at a hinge region 108 of upper component 102 and base component 104. The hinge assembly, which can also be referred to as a clutch barrel, allows upper component 102 to rotate with respect to base component 104 about a rotational axis 110.

The open state of electronic device 100 as shown in FIG. 1A can represent a state for which a sleep mode is not activated based upon the relative orientation of upper component 102 with respect to base component 104. In various embodiments, electronic device 100 entering such an open state from a closed state can be a situation where a sleep mode is exited, which can also be referred to as a wake mode. An "open state" for electronic device 100 can be defined as a state where the electronic device 100 is not closed. This can be for example, an arrangement where the relative orientation of upper component 102 with respect to base component 104 is at a non-zero orientation angle. While this angle is about 90 degrees for the electronic device 100 as shown in FIG. 1A, such a non-zero angle representing an "open state" for electronic device 100 can be anything between about 2 and 150 degrees, for example.

Figure 1B:
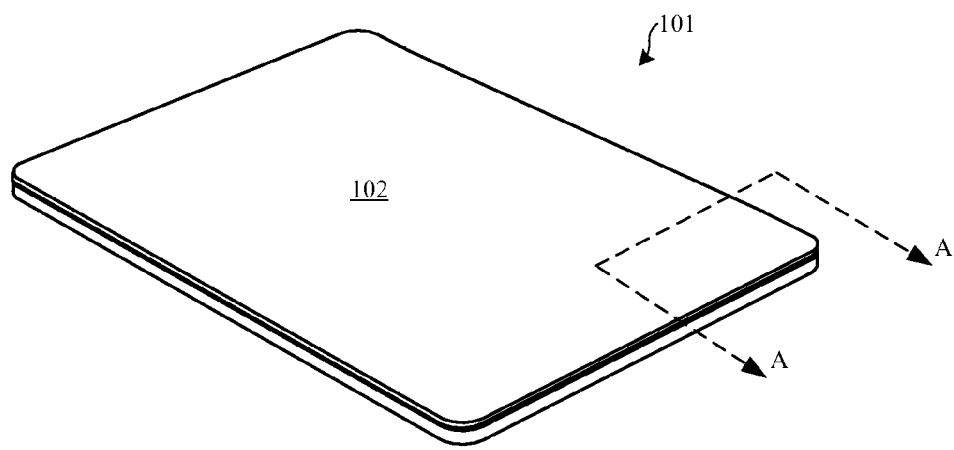
FIG. 1B illustrates in front perspective view the exemplary electronic device of FIG. 1A in a closed state according to various embodiments of the present disclosure.

Continuing with FIG. 1B, the exemplary electronic device of FIG. 1A is illustrated in front perspective view in a closed state or arrangement. Closed state 101 can involve the lid or upper component 102 being shut atop the base component 104, such that the orientation angle between upper component 102 and base component 104 is about zero degrees. Closed state 101 can represent a state or arrangement for which a sleep mode is activated for the electronic device. Where the electronic device 100 enters closed state 101 from an open state, the electronic device can be put into a sleep mode, which can persist while closed state 101 remains. Upon electronic device 100 entering an open state from closed state 101, the sleep mode can end. This can also be termed as entering a wake mode, which can persist until closed state 101 reoccurs. One or more sensors or other components may be located at or within the electronic device 100 to detect when the electronic device is in an open state or closed state 101. Such detection components might be located at or about hinge region 108, such as around section A-A, as shown in greater detail in FIGS. 2-4 below.

Although the above examples have been illustrated with respect to a laptop computer, it will be understood that similar arrangements and concepts may also apply to other types of electronic devices. For example, clamshell type smart phones and hinged supports or other parts of electronic devices can operate similarly, and may also benefit from the various further items, methods, and concepts disclosed herein. As another non-limiting example, clamshell type smart phones or other portable electronic devices may also employ the sleep mode systems as set forth herein, such that these systems are limited for use with laptop computers only.

Figure 2:
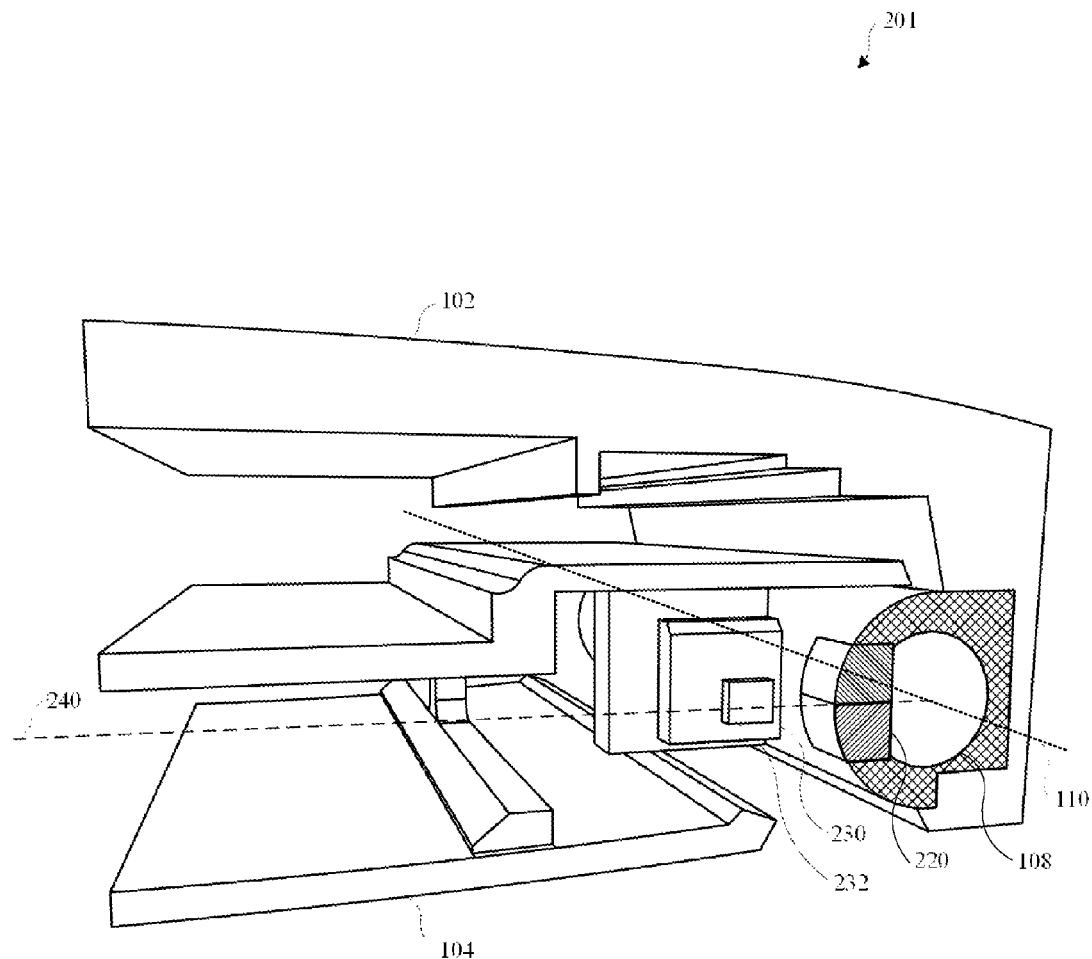
FIG. 2 illustrates in side perspective and partial cross-section view an exemplary sleep mode system region within the electronic device of FIG. 1B in a closed state along section A-A of FIG. 1B according to various embodiments of the present disclosure.

FIG. 2 illustrates in side perspective and partial cross-section view an exemplary sleep mode system region within the electronic device of FIG. 1B in a closed state along section A-A of FIG. 1B according to various embodiments of the present disclosure. Closed state electronic device 201 can include an upper component 102, a base component 104, and a hinge region 108 having a rotational axis 110, such as those set forth in above examples. Closed state electronic device 201 can also include a magnetic component 220 and an integrated circuit ("IC") package 230 having a sensor 232, which sensor can be a sophisticated magnetic sensor chip, for example. In various embodiments, sensor 232 can be an anisotropic magneto-resistive ("AMR") sensor chip or a giant magneto-resistive ("GMR") sensor chip, either of which can be specifically adapted to detect slight variances in the rotational orientation of a magnetic component 220. Sensor 232 can be, for example, an HMC1501 or HMC1512 magnetic displacement sensor manufactured by Honeywell International Inc. of Morristown, N.J., although other specific models and manufacturers for sensor 232 may alternatively be used. As is generally known, sensors such as AMR and GMR chips may be particularly sensitive, and as such can detect differences in magnetic fields where the magnets are rotated by as little as 0.5 degrees. Such detected differences can then be used to calculate or determine the angle of orientation for a given magnet, such as with respect to a base or original angle of orientation for the magnet for which the magnetic field properties or characteristics are known.

Alternatively or in addition, magnets, sensors, and other components that provide for tunneling magnetoresistance ("TMR") can be used to detect slight variances in the rotational orientation of a magnetic component. Such TMR applications can be even more sensitive and use less power than other magnetic applications, depending upon arrangements. As yet another alternative or additional implementation, a three-axis magnetometer and magnet arrangement can be used. This can include, for example, the MLX90393 Triaxis Micropower Magnetometer by Melexis Semiconductors of Tessenderlo, Belgium, among other suitable devices. Use of such a magnetometer can result in sensing both the direction and magnitude of the magnetic field, with such precise measurements then being used to calibrate the system such that every angle and even every fraction of an angle for the internal system magnet(s) are known based upon measured and set directions and magnitudes. External magnetic field sources will virtually always differ in some way and not be able to produce any of the exact same direction and magnitude field vectors, such that the system can be made immune to the influence of external magnetic sources. Magnetometer sensors also tend to be very sensitive, such that a wider variety of locations can be used. For example, one sensor can be placed in a first device component, and another sensor can be placed in another device component that rotates with respect to the first device component. Again, this can be a base component and upper component of a laptop.

As shown in FIG. 2, magnetic component 220 can comprise a magnetic pair that generates a magnetic field having a vector, shown as closed state vector 240. Closed state vector 240 can be a fixed zero or baseline vector, or can have a small amount of displacement or variance that can still be considered closed state, such as, for example, 0 to 2 degrees. Various properties of the generated magnetic field from magnetic component 220 can be detected by sensor 232, particularly when the sensor 232 is located in relative close proximity to the magnetic component 220. In some arrangements, the magnetic component 220 can be disposed within or arranged with respect to the upper component 102 and/or hinge region 108, while the sensor 232 and associated IC package 230 can be disposed within or arranged with respect to the base component 104. Accordingly, magnetic component 220 can rotate with upper component 102 when upper component 102 rotates, while sensor 232 stays with base component 104 and does not rotate. In particular, it can be advantageous to dispose magnetic component 220 within hinge region 108 such that the magnetic component 220 rotates with the upper component 102 while also remaining close to the relatively stationary sensor 232.

Figure 3:
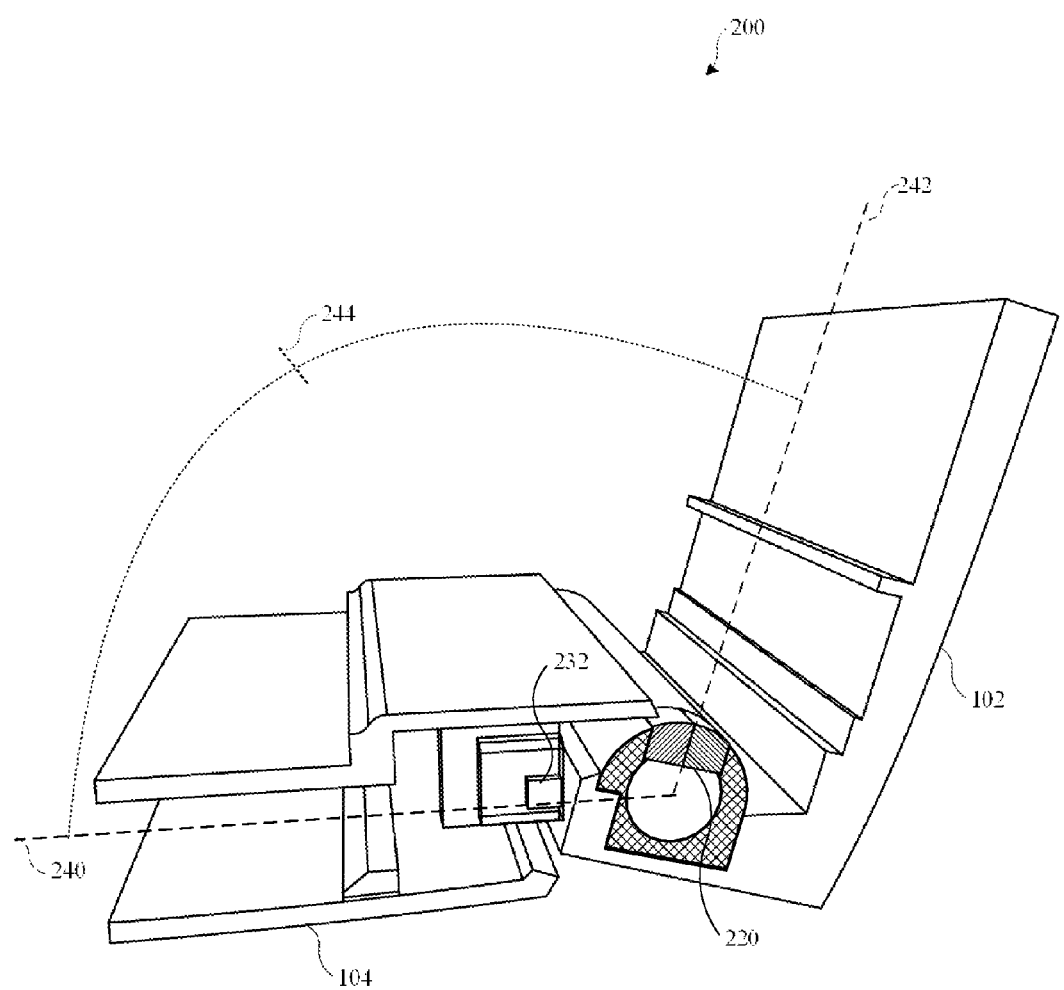
FIG. 3 illustrates in side perspective and partial cross-section view the exemplary sleep mode system region of FIG. 2 with its electronic device in an open state according to various embodiments of the present disclosure.

FIG. 3 illustrates in side perspective and partial cross-section view the exemplary sleep mode system region of FIG. 2 with its electronic device in an open state according to various embodiments of the present disclosure. Open state electronic device 200 is the same electronic device as closed state electronic device 201 shown in FIG. 2, albeit with upper component 102 opened at an angle 244 with respect to base component 104. As shown in FIG. 3, angle 244 is about 110 degrees, although it will again be understood that any angle in a range of about 2 degrees through about 150 degrees can be considered an "open state" for electronic device 200. As also shown in FIG. 3, the sensor 232 can remain in the same location as in FIG. 2, while the magnetic component 220 has rotated equally with the rotation of upper component 102. In addition, the magnetic field vector for magnetic component 220 has also rotated, from closed state vector 240 to variable open state vector 242.

It will be readily appreciated that the magnetic field and corresponding vector generated by magnetic component 220 generally remains the same with respect to the magnetic component 220 itself, but that this magnetic field and vector is seen or detected differently as the magnetic component 220 moves and/or rotates. Accordingly, the relatively stationary sensor 232 detects changes in the magnetic field and vector from the magnetic component 220 as the magnetic component rotates. Specifically, magnetic field properties in the magnetic field generated by magnetic component 220 tend to rotate with the rotation of magnetic component 220. This then results in changes to the properties detected by stationary sensor 232.

Figure 4:
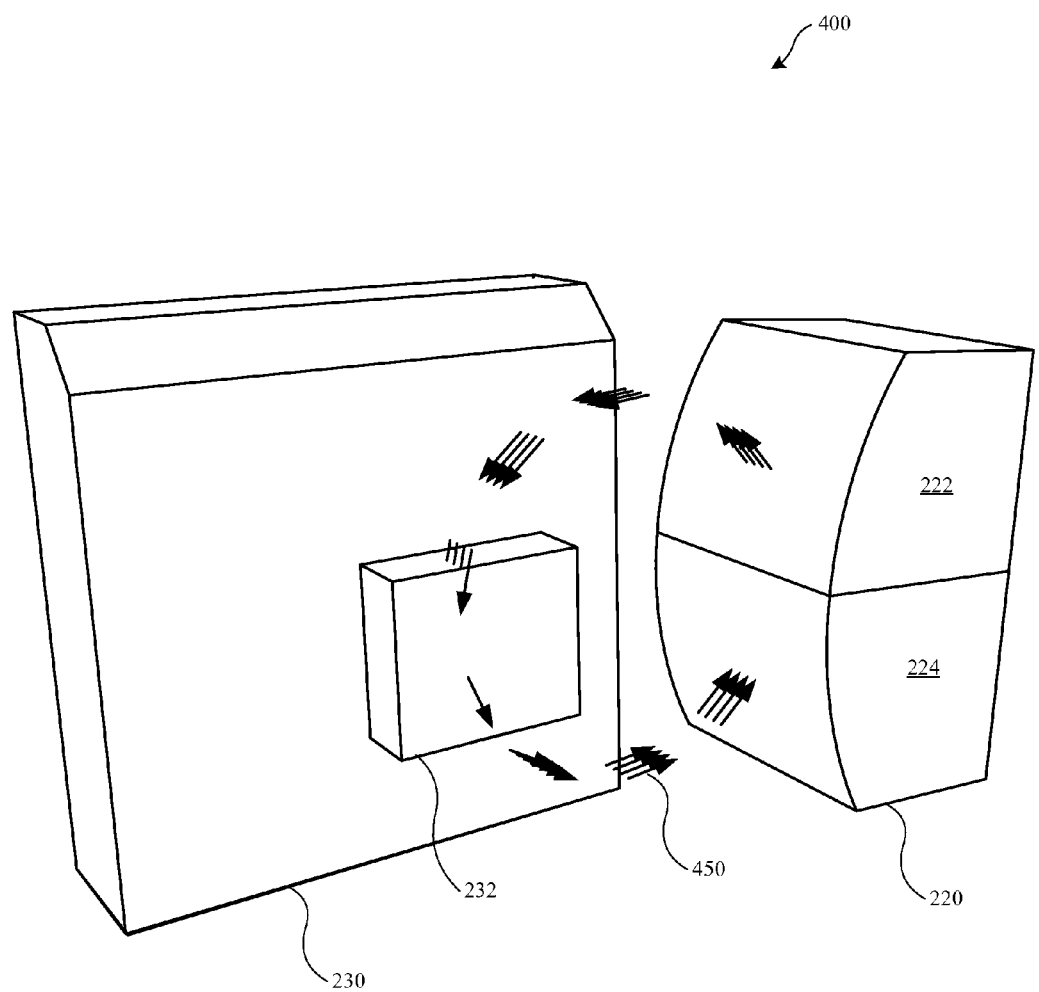
FIG. 4 illustrates in side perspective view an exemplary magnetic component and angle sensor arrangement according to various embodiments of the present disclosure.

This effect is depicted in FIG. 4, which illustrates in side perspective view an exemplary magnetic component and angle sensor arrangement according to various embodiments of the present disclosure. Magnetic component and angle sensor arrangement 400 can include the same magnetic component 220 and sensor 232 as those set forth in the various examples above. Magnetic component 220 can include a north region 222 and south region 224, and sensor 232 can again be included as part of an overall IC package 230. A magnetic field 450 generated by magnetic component 220 can extend through the IC package 230 and sensor 232, where the magnetic field 450 can be detected and its various properties measured. For example, at the slight rotation above zero or "closed state" as shown in FIG. 4, the direction and the strength of the magnetic field may be different at multiple locations on sensor 232. These differences in magnetic field direction and strength can be detected and communicated to processing components in IC package 230 and/or elsewhere on the electronic device, which differences can then be used to determine the angular orientation of magnetic component 220. Again, this determination can match or correspond to the angular orientation of the upper component 102 with respect to the base component 104 of the overall electronic device 100, which can be used to determine an open or closed state for the electronic device, which can in turn be used to decide whether to put the device into or out of a sleep mode.

In various embodiments, the angular orientation determination can be used for other purposes beyond whether to put the device into or out of a sleep mode. For example, an antenna performance and/or a thermal performance of the device can be affected by the angular position of one device component with respect to another device component, such as a device display with respect to a device base. An overall system within the electronic device can use the angular orientation determination then to change an operation of the device, such as to improve performance or to conserve energy. For example, a boost of an antenna function for a WiFi or other wireless signal may be appropriate for some angular orientations, while a reduction of the antenna function may be appropriate for other angular orientations. As another example, a fan operation or other thermal performance operation might be triggered in the direction of a boost or a reduction due to the angular orientation determination, such as where certain angles are more prone to greater heat generation within a portion of the device.

As noted above, the rotation of magnetic component 220 can match the rotation of the upper component 102 of electronic device 100, such that the angle between closed state vector 240 and variable open state vector 242 matches the angle between upper component 102 and base component 104. In various alternative embodiments, the rotation of magnetic component 220 may only correspond to the rotation of upper component 102, such as by a factor of 2 or ½, or by an offset amount where one or the other rotates some amount without any rotation of the other. Any and all such factors and offsets can be accounted for in the process of determining the orientation angle of the upper component 102 with respect to the lower component 104, as will be readily appreciated.

Various advantages can be realized through the use of such a sleep mode system that utilizes an angle sensor, such as a GMR or AMR sensor, or a TMR arrangement or three-axis magnetometer arrangement, rather than a Hall Effect sensor. For example, a GMR or AMR sensor tends to be more accurate, and can be used to determine an angle to within 0.5 degrees. Further, an angular vector can be spread out over a field, as opposed to a linear distance, such that magnetic field changes can be measured at more locations for greater sensitivity and accuracy. In addition, unlike a Hall Effect sensor, a GMR or AMR sensor can be optimized both in terms of angular accuracy and field strength by putting the sensor in close proximity to the magnet. This flexibility allows for greater movement within where the sensor and magnet can be located. For example, the magnetic component 220 and sensor 232 disclosed herein can be located at virtually any place along the hinge region 108 for electronic device 100, which provides greater allowance for part sizes and other component considerations. In various embodiments, it can be advantageous always to keep the relevant sensor(s) within the magnetic field of the relevant magnet(s). In such arrangements, such a feature can make it much less likely that any external magnetic field will be detected and used in a manner to trigger the overall system, due to the system magnet always being detected. In contrast, Hall Effect sensor arrangements are often susceptible to false triggers when the system magnet is out of range or far away from the system sensor.

In various embodiments, a given sleep mode system comprising a magnetic component 220, a sensor 232, and one or more controllers or processing components may be installed and set to operate within a given electronic device with reasonable expectations of reliance given the actual components being used. In some embodiments, further steps or conditions may be applied, such as to zero or calibrate these components, or even to take actual measurements and provide the processing components with actual values for the properties detected at different critical angles. In this manner, variances in the structural makeup of components and their relative locations can be accounted for from device to device.

For example, a given electronic device 100 can be provided with a testing or calibration process for its magnetic component 220, sensor 232, IC package 230, and/or other items after these items have been installed into the device. One reading at sensor 232 can be taken when the given electronic device 100 is known to be fully closed, with the properties detected at this time then being recorded at a memory or other local storage associated with IC package 230 or another associated processor or controller. Another reading can be taken when the given electronic device is slightly opened to some minimum threshold level, such as about 2 degrees, with the properties detected again being recorded. Further readings can be taken as may be desired for one or more additional angles. These recorded values can then be used later during ordinary device operations to assist with determining the actual orientation angle, or just generally whether an open state or closed state exists for the device.

Figure 5:
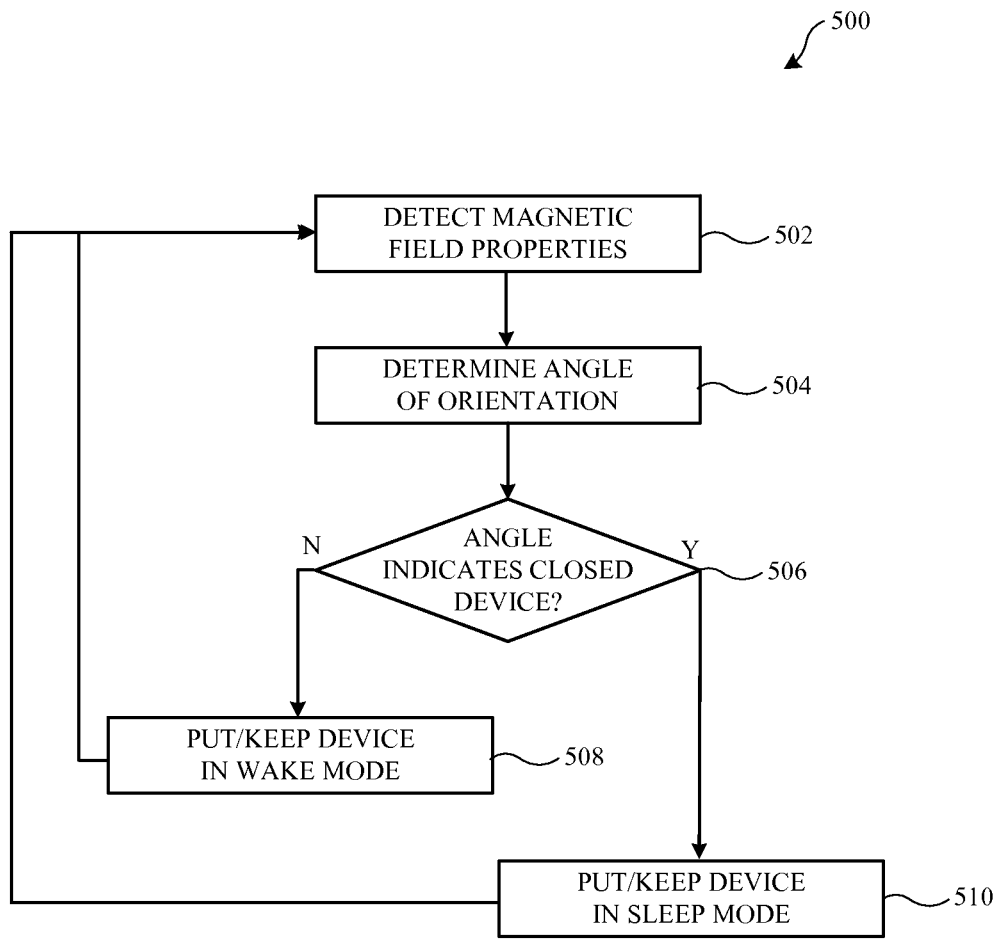
FIG. 5 illustrates a flowchart of an exemplary method for operating a sleep mode system within an electronic device according to various embodiments of the present disclosure.

FIG. 5 illustrates a flowchart of an exemplary method for operating a sleep mode system within an electronic device according to various embodiments of the present disclosure. Method 500 can be carried out by one or more processors or other controllers that may also be located on the electronic device where the sleep mode system is located, such as IC package 230 and/or an overall device CPU, for example. Method 500 can start at a process step 502, where magnetic field properties are detected. This can be done by a sensor, such as sensor 232 above, or may be at a controller, such as by way of communications from sensor 232. An angle of orientation can then be determined at process step 504, which can represent the angle between upper and base components of the electronic device, for example. Such a determination can be by way of that which is set forth in greater detail above. As also noted above, the angular orientation determination can be used for other purposes beyond whether to put the device into or out of a sleep mode. For example, an antenna performance and/or a thermal performance of the device can be affected by the angular position of one device component with respect to another device component.

At a subsequent decision step 506, an inquiry can be made as to whether the angle of orientation indicates that the device is closed. In some embodiments, this can mean whether or not the angle is less than about 2 degrees. Of course, other values can be used if desired, such as 1 or 0 degrees, or more than 2 degrees. If the angle of orientation does not indicate that the device is closed at decision step 506, then the method moves to process step 508, where the electronic device is kept (or put) in wake mode, after which the method reverts to process step 502 to be repeated. If the angle of orientation does indeed indicate that the device is closed at decision step 506, however, then the method moves to process step 510, where the electronic device is put (or kept) in sleep mode, after which the method reverts to process step 502 to be repeated. Again, it will be appreciated that putting or keeping the electronic device (e.g., laptop computer) into a sleep mode conserves battery power or energy in general for the electronic device, such that sleep mode may be preferable whenever the electronic device is closed.

For the foregoing flowchart, it will be readily appreciated that not every step provided is always necessary, and that further steps not set forth herein may also be included. For example, added steps that involve calibrating the specific magnetic component and sensor for the device may be added. Also, steps that provide more detail with respect to determining the angle or providing communications therefor may also be added. Furthermore, the exact order of steps may be altered as desired, and some steps may be performed simultaneously.

Figure 6:
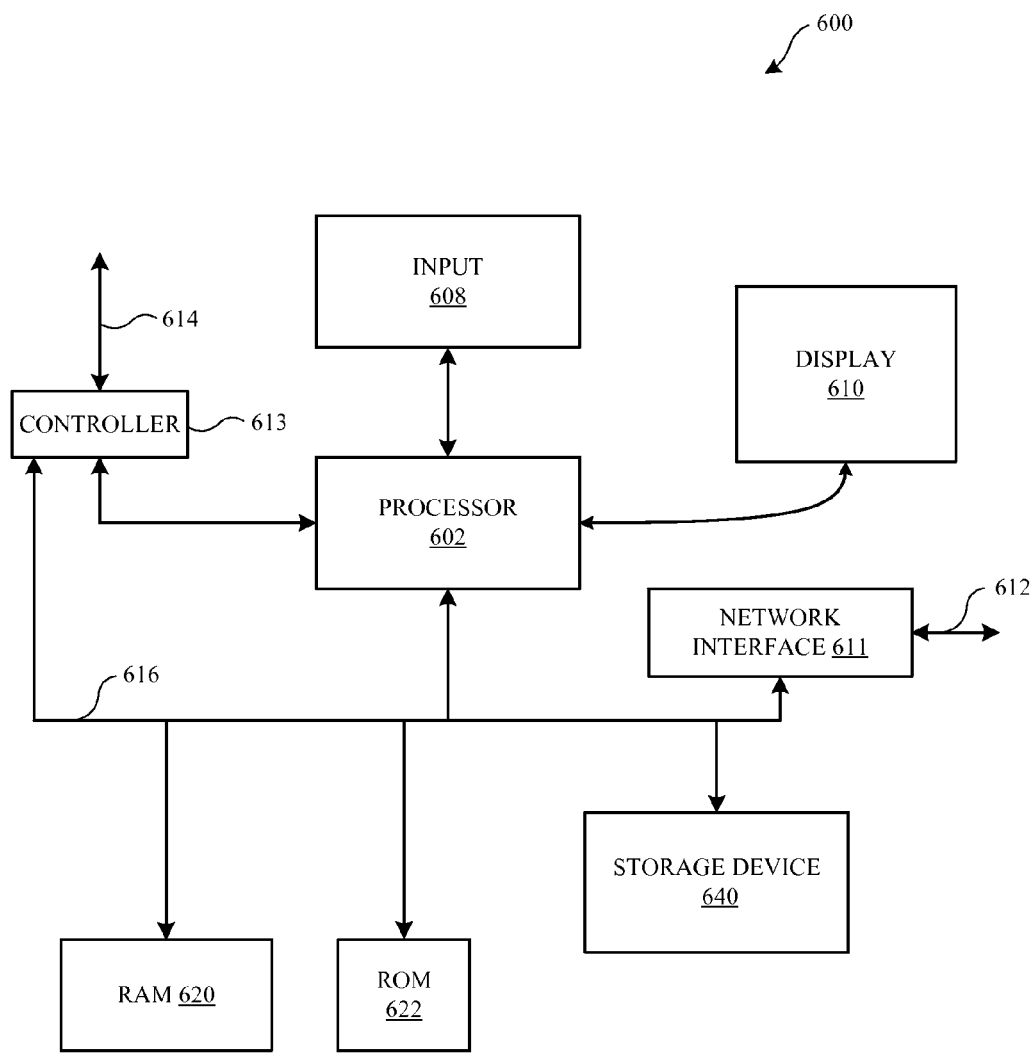
FIG. 6 illustrates in block diagram format an exemplary computing device that can be used to implement the various components and techniques described herein according to various embodiments of the present disclosure.

FIG. 6 illustrates in block diagram format an exemplary computing device 600 that can be used to implement the various components and techniques described herein, according to some embodiments. In particular, the detailed view illustrates various components that can be included in the electronic device 100 illustrated in FIG. 1A. Such components can include a sleep mode system, such as that which is shown in FIG. 2, as well as a processor that controls the sleep mode system, such as by way of the method shown in FIG. 5. As shown in FIG. 6, the computing device 600 can include a processor 602 that represents a microprocessor or controller for controlling the overall operation of computing device 600. The computing device 600 can also include a user input device 608 that allows a user of the computing device 600 to interact with the computing device 600. For example, the user input device 608 can take a variety of forms, such as a button, keypad, dial, touch screen, audio input interface, visual/image capture input interface, input in the form of other sensor data, etc. Still further, the computing device 600 can include a display 610 (screen display) that can be controlled by the processor 602 to display information to the user (for example, a movie or other AV or media content). A data bus 616 can facilitate data transfer between at least a storage device 640, the processor 602, and a controller 613. The controller 613 can be used to interface with and control different equipment through and equipment control bus 614. Such equipment can include, for example, a sleep mode system and sensors for same, such as that which is disclosed herein. The computing device 600 can also include a network/bus interface 611 that couples to a data link 612. In the case of a wireless connection, the network/bus interface 611 can include a wireless transceiver.

The computing device 600 can also include a storage device 640, which can comprise a single disk or a plurality of disks (e.g., hard drives), and includes a storage management module that manages one or more partitions within the storage device 640. In some embodiments, storage device 640 can include flash memory, semiconductor (solid state) memory or the like. The computing device 600 can also include a Random Access Memory (RAM) 620 and a Read-Only Memory (ROM) 622. The ROM 622 can store programs, utilities or processes to be executed in a non-volatile manner. The RAM 620 can provide volatile data storage, and stores instructions related to the operation of the computing device 600.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium. The computer readable medium is any data storage device that can store data which can thereafter be read by a computer system. Examples of the computer readable medium include read-only memory, random-access memory, CD-ROMs, DVDs, magnetic tape, hard disk drives, solid state drives, and optical data storage devices. The computer readable medium can also be distributed over network-coupled computer systems so that the computer readable code is stored and executed in a distributed fashion.

The foregoing description, for purposes of explanation, uses specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. An angular detection system configured for use in an electronic device, the angular detection system comprising:
    a magnetic component configured to reside at a hinge portion rotationally coupling a first electronic device component with a second electronic device component, the magnetic component generating a magnetic field having a magnetic field strength and a direction, wherein the magnetic component is rotationally fixed to the hinge portion such that the magnetic field direction remains fixed with respect to the hinge portion; and
    a sensor configured to reside at the second electronic device component disposed proximate the magnetic component, the sensor further configured to detect one or more magnetic field properties that include the magnetic field direction that vary according to a variable rotation of the magnetic component with respect to the sensor, wherein the variable rotation of the magnetic field direction corresponds to a rotation angle of the hinge portion coupled to the first electronic device component with respect to the second electronic device component.

2. The angular detection system of claim 1, wherein the sensor comprises an anisotropic magneto-resistive ("AMR") sensor or a giant magneto-resistive ("GMR") sensor.

3. The angular detection system of claim 1, wherein the first electronic device component is an upper component of a laptop computer, and the second electronic device component is a base component of the laptop computer.

4. The angular detection system of claim 1, wherein the sensor is further configured to provide a signal regarding the one or more detected magnetic field properties.

5. The angular detection system of claim 4, further comprising:
    a controller in communication with the sensor and configured to receive the signal, wherein the controller is further configured to determine an orientation angle of the magnetic component based upon the one or more detected magnetic field properties.

6. The angular detection system of claim 5, wherein the controller is further configured to put the electronic device into a sleep mode when the determined orientation angle indicates a closed condition for the electronic device.

7. The angular detection system of claim 5, wherein the controller is further configured to affect an antenna performance or a thermal performance of the electronic device based upon the determined orientation angle.

8. The angular detection system of claim 6, wherein the sensor is sensitive enough to detect variances in the one or more magnetic field properties that results in an error range of less than two degrees for the determined orientation angle.

9. An electronic device comprising:
    a first device component;
    a second device component rotationally coupled to the first device component by a hinge portion; and
    an angular detection system configured to determine an angle of orientation of the first device component with respect to the second device component, the angular detection system including:
        a magnetic component disposed within the electronic device, the magnetic component generating a magnetic field having a magnetic field strength and a direction, wherein the magnetic component is rotationally fixed to the hinge portion such that the magnetic field direction remains fixed with respect to the hinge portion,
        a sensor disposed within the electronic device proximate the magnetic component and configured to detect the magnetic field direction of the magnetic field generated by the magnetic component, and
        a controller in communication with the sensor and configured to receive a signal therefrom regarding the detected magnetic field direction, wherein the controller is further configured to determine an orientation of the magnetic component based on the signal.

10. The electronic device of claim 9, wherein the orientation of the magnetic component corresponds to the angle of orientation of the first device component with respect to the second device component.

11. The electronic device of claim 9, wherein the magnetic field varies according to the orientation of the magnetic component.

12. The electronic device of claim 9, wherein the first device component is an upper component of a laptop computer and the second device component is a base component of the laptop computer.

13. The electronic device of claim 9, wherein the controller is further configured to put the electronic device into a sleep mode in response to a magnetic component orientation determination indicating that the electronic device is closed.

14. The electronic device of claim 13, wherein the controller is further configured to wake the electronic device from the sleep mode in response to a subsequent magnetic component orientation determination indicating that the electronic device is open.

15. A method for implementing a sleep mode in an electronic device, the method comprising:
   determining an angle of orientation for a magnetic component located within the electronic device, wherein the magnetic component generates a magnetic field having a magnetic field strength and a direction, is rotationally fixed to a hinge portion rotationally coupled to one or more components such that the magnetic field direction remains fixed with respect to the hinge portion, and configured to rotate with respect to the one or more components within the electronic device; and
   putting the electronic device into the sleep mode when it is determined from the angle of orientation that the electronic device is closed.

16. The method of claim 15, further comprising:
   waking the electronic device from the sleep mode when it is determined from the angle of orientation that the electronic device is open.

17. The method of claim 15, wherein putting the electronic device into the sleep mode includes reducing a power consumption level of the electronic device.

* * * * *